United States Patent [19]

Itoh

[11] Patent Number: 5,155,054
[45] Date of Patent: Oct. 13, 1992

[54] METHOD OF MANUFACTURING A SEMICONDUCTOR MOSFET HAVING A PROJECTION T-SHAPED SEMICONDUCTOR PORTION

[75] Inventor: Masahiro Itoh, Tokyo, Japan

[73] Assignee: Oki Electric Industry Co., Ltd., Tokyo, Japan

[21] Appl. No.: 775,444

[22] Filed: Oct. 15, 1991

Related U.S. Application Data

[62] Division of Ser. No. 588,574, Sep. 26, 1990.

[30] Foreign Application Priority Data

Sep. 28, 1989 [JP] Japan .................. 63-250779

[51] Int. Cl.$^5$ ........................... H01L 21/265
[52] U.S. Cl. ........................... 437/41; 437/42; 437/44; 437/45; 357/23.4
[58] Field of Search ............ 437/41, 42, 44, 45; 357/23.4

[56] References Cited

U.S. PATENT DOCUMENTS

| | | | |
|---|---|---|---|
| 4,751,196 | 6/1988 | Pennell et al. | 437/41 |
| 4,892,835 | 1/1990 | Rabinzohn et al. | 437/44 |
| 4,992,388 | 2/1991 | Pfiester | 437/41 |
| 4,997,778 | 3/1991 | Sim et al. | 437/44 |
| 5,053,348 | 10/1991 | Mishra et al. | 437/41 |

Primary Examiner—Brian E. Hearn
Assistant Examiner—Kevin M. Picardat
Attorney, Agent, or Firm—Spencer, Frank & Schneider

[57] ABSTRACT

A MOSFET having a projecting T-shaped semiconductor portion and a method of manufacturing the same. The MOSFET includes a semiconductor body having a first diffusion region of a first conductivity type, a T-shaped semiconductor portion projecting from the semiconductor body, a gate insulator film formed on a surface of said T-shaped portion, and a gate electrode formed on the gate insulator film. The top of the T provides a means by which contact can easily be made between a highly concentrated impurity region on the projecting portion and an electrode, even if the cross-sectional area of the base of the T is narrow. In a method of manufacturing the MOSFET a mask layer is placed on the semiconductor body with a hole which exposes the semiconductor body, a layer of semiconductor material is provided in the hole and on a portion of the mask layer around the hole so as to form the T-shaped portion, the mask layer is removed by the wet etching, a gate insulating layer is formed onside surfaces of the T-shaped portion, a gate electrode layer is formed on the gate insulating layer, and an impurity is introduced into the top of the T-shaped portion and a predetermined region of the semiconductor body located adjacent to the T-shaped portion.

15 Claims, 7 Drawing Sheets

METHOD OF MANUFACTURING A SEMICONDUCTOR MOSFET HAVING A PROJECTION T-SHAPED SEMICONDUCTOR PORTION

This is a division of application Ser. No. 07/588,574 filed Sep. 26, 1990.

CROSS REFERENCE TO RELATED APPLICATION

This application claims the priority of Japanese Application Ser. No. 1-250,779, filed Sep. 28, 1989, the subject matter of which is incorporated herein by reference.

BACKGROUND OF THE INVENTION

The invention relates to a semiconductor device and more particularly, to a MOSFET having a semiconductor projection in the shape of a T.

Figure 1:
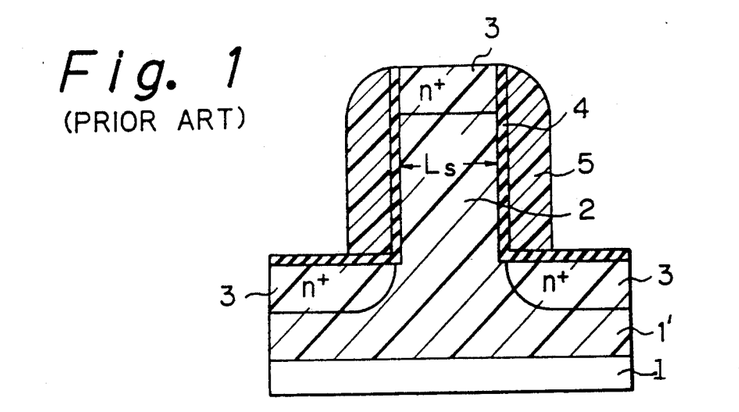
FIG. 1 is a sectional view of a prior art semiconductor MOSFET having a semiconductor projection.

A typical known MOSFET having a semiconductor projection is described in "High Speed and Highly reliable Trench MOSFET with Dual-Gate", 1988 SYMPOSIUM ON VLSI TECHNOLOGY, Digest of Technical Papers pp. 23-24. FIG. 1 is a cross-sectional view of the MOSFET described in the paper. Referring to FIG. 1, the MOSFET has a silicon projection 2 in the shape of an "I" on a p-well region 1' formed on a silicon substrate 1. The silicon projection 2 is formed by dry-etching the p-well region 1'. Highly concentrated impurity regions 3 are formed in the p-well region 1' around the silicon projection 2 and on the top of the silicon projection 2. A gate oxide layer 4 is formed on the side of the silicon projection 2. A polycrystalline silicon (hereafter poly-Si) layer 5 having low electrical resistance is formed on the gate oxide layer 4.

The above-mentioned MOSFET has a high transconductance ($g_m$). Where the width $L_s$ of the icon projection 2 is narrow, the MOSFET has a remarkable high transconductance $g_m$. Moreover, the MOSFET has less of a decrease of its transconductance $g_m$ in comparison to planar MOSFET's, as measured by a stress test.

However, since the silicon projection 2 is formed by dry-etching, there is a probability of serious damage, such as crystal defects, occurring during production on the side of the silicon projection 2. A high temperature treatment can recover some but not all of the damage. Furthermore, where the width of the silicon projection 2 is narrow, it is difficult to assure contact between the highly concentrated impurity region 3 on the top of the silicon projection 2 and an electrode.

SUMMARY OF THE INVENTION

It is an object of the invention to provide a semiconductor MOSFET having a semiconductor projection which has no damage on the sides thereof. It is another object of the invention to provide a semiconductor MOSFET having a high transconductance. It is still another object of the invention to provide a MOSFET with which contact can easily be made between a highly concentrated impurity region and an electrode even if the width of the semiconductor projection is narrow.

A semiconductor MOSFET according to the invention includes a semiconductor body having a first diffusion region and a projecting semiconductor portion formed on and projecting from the semiconductor body. The projecting portion has a first portion which projects from the semiconductor body in a given direction. The projecting portion also includes a second portion disposed on a free end of the first portion. The second portion has a cross-sectional area which is greater than that of the first portion. The second portion has a second diffusion region of the same conductivity type as that of the first diffusion region. A gate insulator film is formed on a surface of the semiconductor portion, and a gate electrode is formed on the gate insulator film.

A method of manufacturing a MOSFET having a semiconductor projection according to the invention includes the steps of preparing a semiconductor body, for example, a semiconductor substrate, forming a mask layer on the semiconductor body, the mask layer having a hole which exposes the semiconductor body, forming a semiconductor layer in the hole and on the mask layer around the hole, a section of the semiconductor layer being in the shape of a T, and removing the mask layer by a wet etching method. Then, a gate insulating layer is formed on the surface of the semiconductor layer, a gate electrode layer is formed on the gate insulating layer, and impurities are introduced into the top of the semiconductor layer and a predetermined region of the semiconductor body adjacent to the semiconductor layer.

BRIEF DESCRIPTION OF THE DRAWINGS

These and other features and advantages of the invention will be further understood from the following detailed description of the preferred embodiments with reference to the accompanying drawings in which.

DESCRIPTION OF THE PREFERRED EMBODIMENTS

Figure 2A:
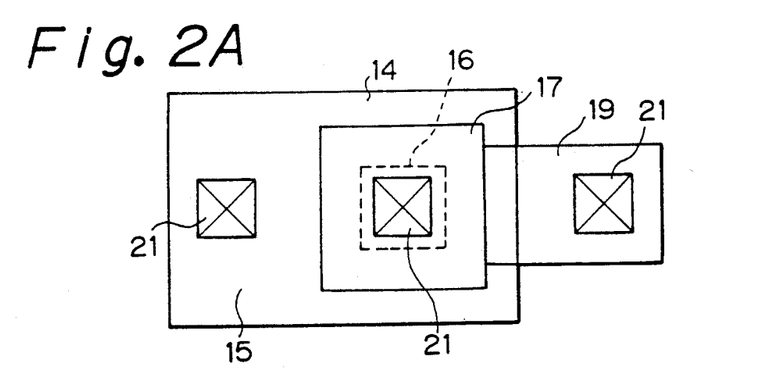
FIG. 2A is a plan view of an n-channel semiconductor MOSFET having a semiconductor projection according to a first embodiment of the invention.
Figure 2B:
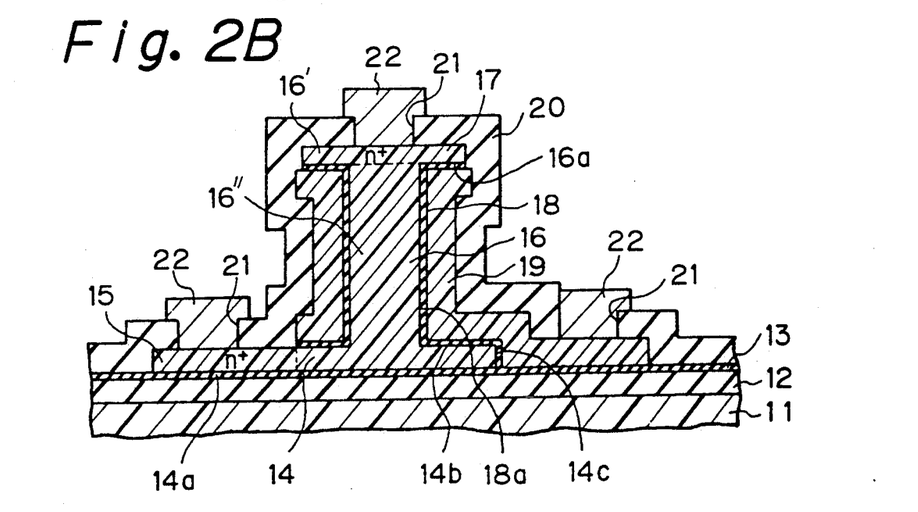
FIG. 2B is a sectional view of the MOSFET according to the first embodiment of the invention.

FIGS. 2A and 2B show a first embodiment of an n-channel semiconductor MOSFET having a semiconductor projection according to the invention. An oxide layer 12 is formed on a silicon substrate 11. A nitride layer 13 is formed on the oxide layer 12. On part of the nitride layer 13, a patterned poly-Si layer 14 is formed. N-type impurities are introduced into one lateral side 14a (the left side in FIG. 2B) of the poly-Si layer 14 so as to form a source region 15. On the other side (right side) of the poly-Si layer 14, a poly-Si projection 16 which is radially symmetrical with respect to its vertical axis is formed. The poly-Si projection 16 has a greater cross-sectional area in its top portion 16' than in its vertical portion 16″ and is, in vertical section, in the shape of a T whose base is along the vertical portion 16″ and projects from the poly-Si layer 14 and whose top is along the top portion 16′. N-type impurities are introduced into the top portion 16′ of the poly-Si projection 16 to form a drain region 17. A thin gate oxide layer 18 is formed on the side surface 18a of the poly-Si projection 16, on the under surface 16a of the top portion 16′ of the poly-Si projection 16 and on the right top surface 14b and the side surface 14c of the poly-Si layer 14. A poly-Si gate electrode 19 is formed on the thin oxide layer 18 and extends onto the nitride layer 13. An insulating layer 20 covers all the structure mentioned above except contact regions 21 which are located on the source region 15, on the drain region 17 and on the extended gate electrode. On the contact regions 21, aluminum (Al) electrodes 22 are formed.

A method of manufacturing a semiconductor MOSFET having a semiconductor projection according to the first embodiment of the invention is shown in and described with reference to FIGS. 3A to 3F.

Figure 3A:
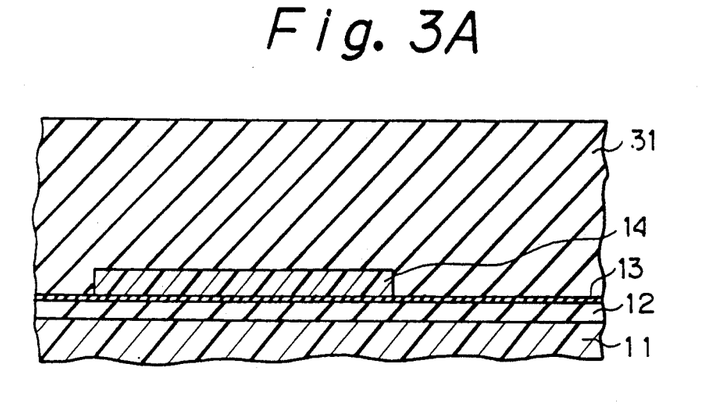
FIGS. 3A to 3F are sectional views showing various steps in the method of manufacturing the MOSFET of the first embodiment of the invention.

First, a silicon substrate 11 is prepared, and a silicon oxide layer 12 of a thickness of about 1000 A is formed on the silicon substrate 11 by thermal oxidation. A silicon nitride layer 13 of a thickness of about 200 A is deposited on the silicon oxide layer 12 by the chemical vapor deposition (hereafter "CVD") method. A first poly-Si layer of a thickness of about 3000 A is formed on the silicon nitride layer 13 by the CVD method, and the first poly-Si layer is selectively removed by photolithographic etching to form a patterned poly-Si layer 14. An oxide layer 31 is deposited on the patterned poly-Si layer 14 and the silicon nitride layer 13 by the CVD method. The oxide layer 31 has a thickness of about 1 micrometer (FIG. 3A).

Figure 3B:
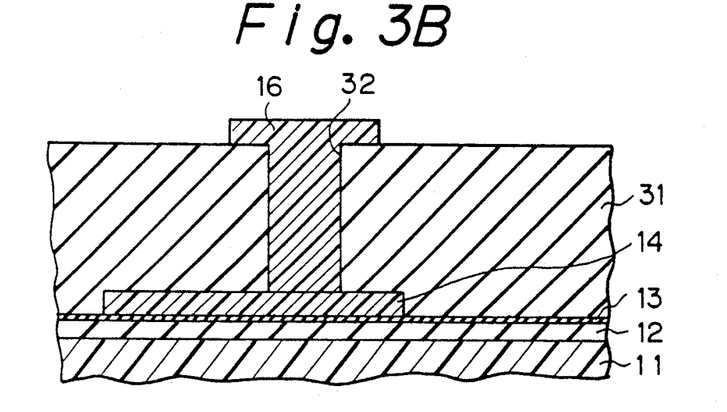

Next, portions of the oxide layer 31 are selectively removed by photolithographic etching to form a hole 32 which exposes the patterned poly-Si layer 14. The hole 32 has a diameter of about 0.8-1 μm. The hole 32 is located on the other side of the patterned poly-Si layer 14. A second poly-Si layer is deposited in the hole 32 and on the oxide layer 31 by the low pressure CVD (hereafter LPCVD) method. The second poly-Si layer is removed except in the hole 32 and on the oxide layer around the hole 32 so as to form a T-shaped poly-Si projection 16 on the other side of the patterned poly-Si layer 14 (FIG. 3B).

Next, the remainder of the oxide layer 31 is removed by hydrofluoric acid solution (wet etching method). Since poly-Si and silicon nitride are scarcely effected by hydrofluoric acid solution, only the oxide layer 31 is removed by hydrofluoric acid solution. Thus, the poly-Si projection 16 is obtained without using the dry etching process and accordingly there is no dry etching induced damage to the poly-Si projection 16.

Figure 3C:
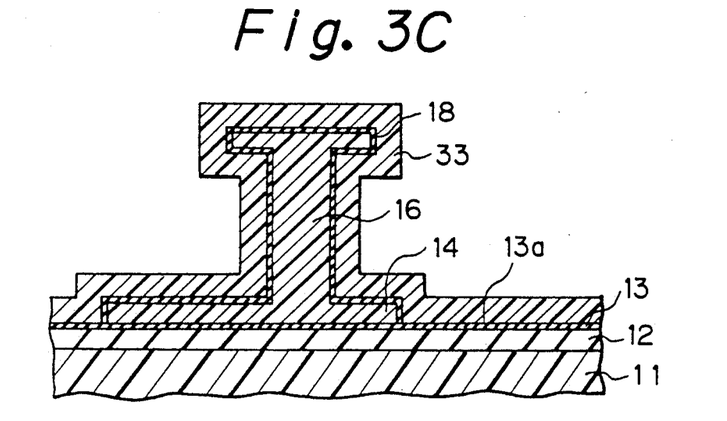

A thin silicon oxide layer 18 of a thickness of about 120-150 A is formed on the surface of the patterned poly-Si layer 14 and the poly-Si projection 16 by thermal oxidation. The thin oxide layer 18 works as a gate oxide layer of the MOSFET. A gate electrode poly-Si layer 33, having a thickness of about 3000 A and which has a low resistance, is deposited on the thin oxide layer 18 and the silicon nitride layer 13 by the LPCVD method (FIG. 3C).

Next, the gate electrode poly-Si layer 33 and the thin silicon oxide layer 18 are removed in turn by anisotropic dry etching, except on the vertical portion 16″ of the poly-Si projection 16, the right side of the patterned poly-Si layer 14 and a predetermined region 13a of the silicon nitride layer 13 which extends from the right side of the patterned poly-Si layer 14, so as to form a gate electrode 19. Since the vertical portion 16″ of the poly-Si projection 16 is shadowed by its top portion 16′, a mask of the anisotropic etching is needed only over the other side of the patterned poly-Si layer 14 and the predetermined region 13a. After that, phosphorous ions or arsenic ions are introduced into the top portion 16′ of the silicon projection 16 and the left side 14a of the patterned poly-Si layer 14 by ion implantation to respectively form an n+ drain region 17 and an n+ source region 15 as shown in FIG. 3D.

Figure 3D:
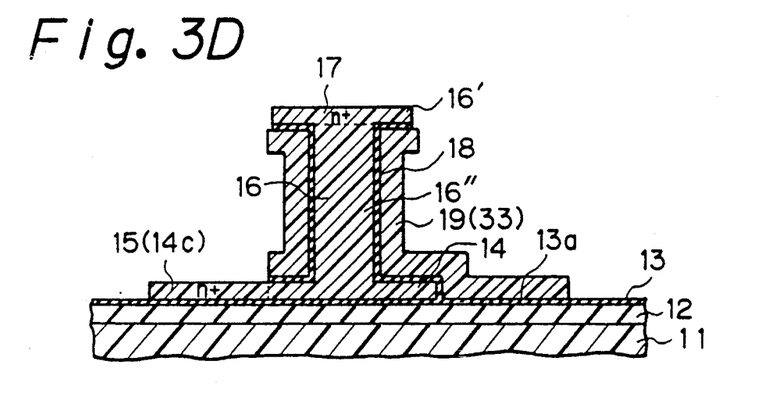
Figure 3E:
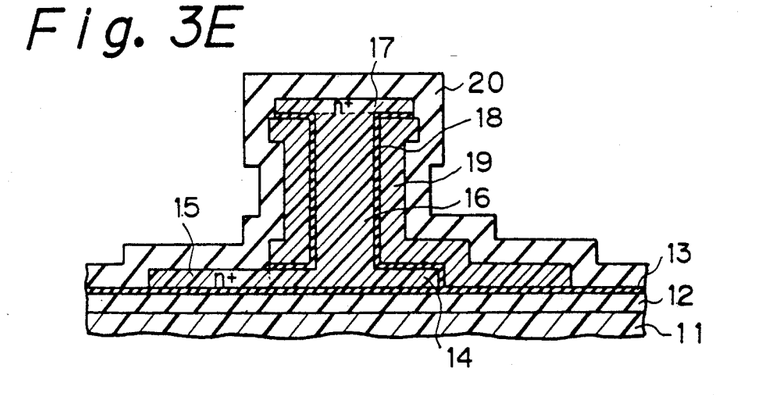
Figure 3F:
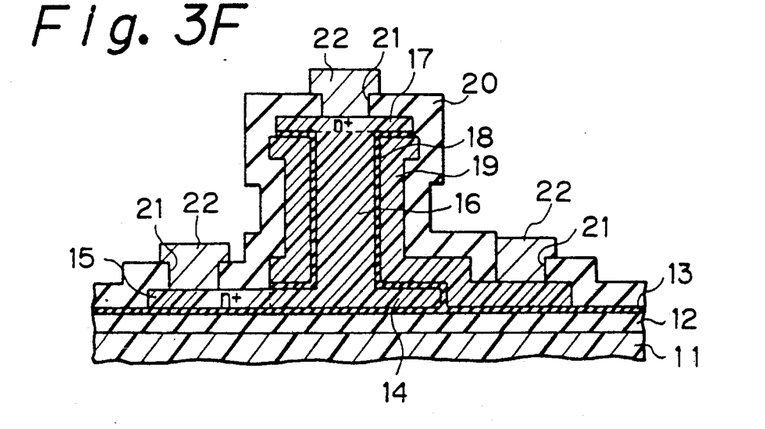

An insulating layer 20 is formed on the surface of the structure shown in FIG. 3D to obtain the structure shown in FIG. 3E. Portions of the insulating layer 20 are selectively removed to form contact holes 21 on the source region 15, the drain region 17 and a part of the gate electrode 19. Wiring 22 is formed in the contact holes 21 (FIG. 3F).

The drain region 17 can be wide even when the vertical portion 16″ of the poly-Si projection 16 is thin. Thus, it is easy to form wiring 22 on the drain region 17.

Figure 4A:
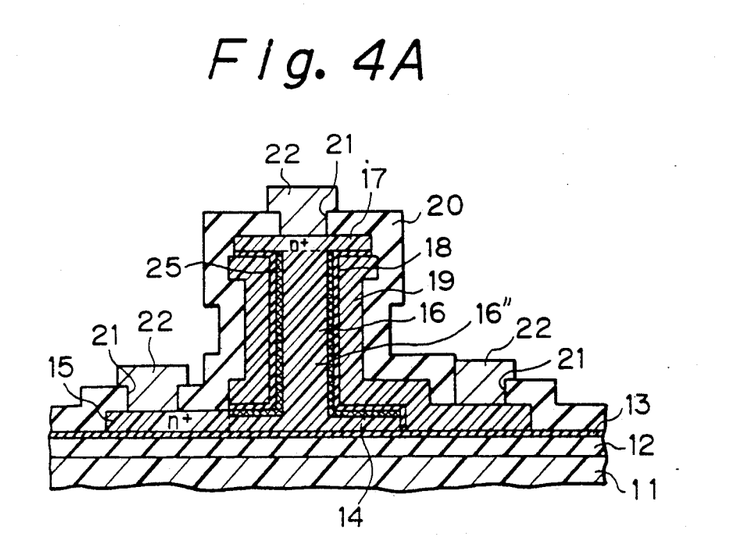
FIGS. 4A and 4B are sectional views showing a channel region of the MOSFET of the invention.

Referring to FIG. 4A, the vertical portion 16″ of the poly-Si projection 16 usually has a conductivity type (p type) opposite to that of the source and drain regions 15, 17. In this case, a channel region 25 of the MOSFET is formed on the surface of the vertical portion 16″ of the poly-Si projection 16 and the right side of the patterned poly-Si layer 14.

Figure 4B:
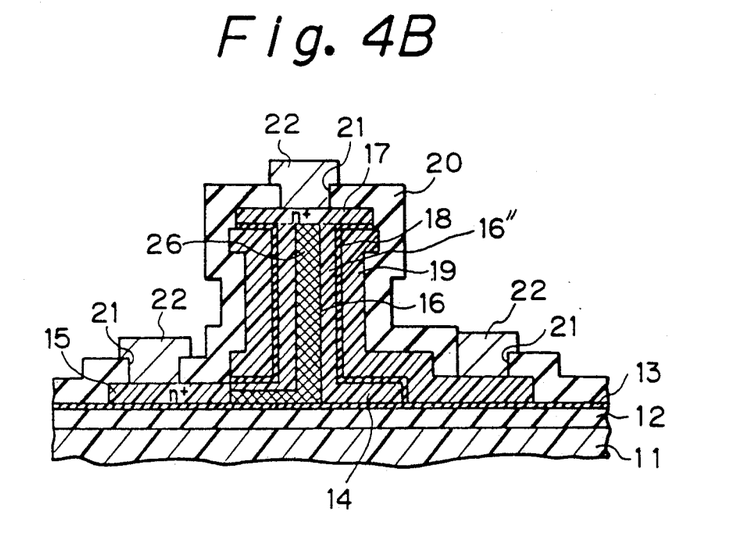

It is possible that the vertical portion 16″ of the poly-Si projection 16 may have the same conductivity type (n type) as that of the source and drain regions 15, 17. In this case, the vertical portion 16″ has a lower impurity concentration than do the source and drain regions. A channel region 26 of the MOSFET is formed in the middle of the poly-Si projection 16 (see FIG. 4B).

Figure 5A:
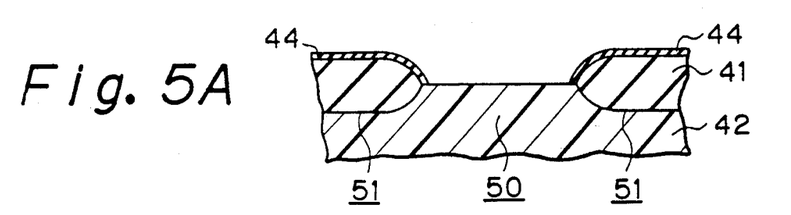
FIGS. 5A to 5F are sectional views showing various steps in a method of manufacturing a semiconductor MOSFET having a semiconductor projection according to a second embodiment of the invention.

A method of manufacturing a semiconductor MOSFET having a semiconductor projection according to the second embodiment of the invention is shown in and described with reference to FIGS. 5A to 5F. Referring to FIG. 5A, a silicon substrate 42 is first prepared, and a field oxide layer 41 is formed on the silicon substrate 42 by local oxidation. A silicon nitride layer 44 is deposited on the field oxide layer 41 and the silicon substrate 42 by the CVD method. The silicon nitride layer 44 is selectively removed by photolithographic etching to expose the silicon substrate 42. The exposed region of the silicon substrate is an active region 50 and the unexposed region is a field region 51.

Figure 5B:
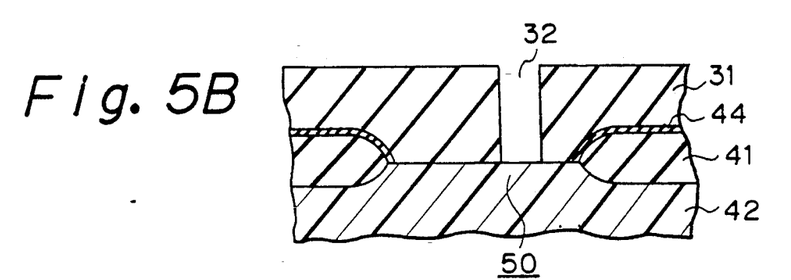

Referring to FIG. 5B, an oxide layer 31 is next deposited on the active region 50 and the field region 51 by the CVD method. A thickness of the oxide layer 31 is about 1 μm. The oxide layer 31 is selectively removed by photolithographic etching to form a hole 32 which exposes a part of the active region 50. The diameter of the hole 32 is about 0.8-1 μm.

Figure 5C:
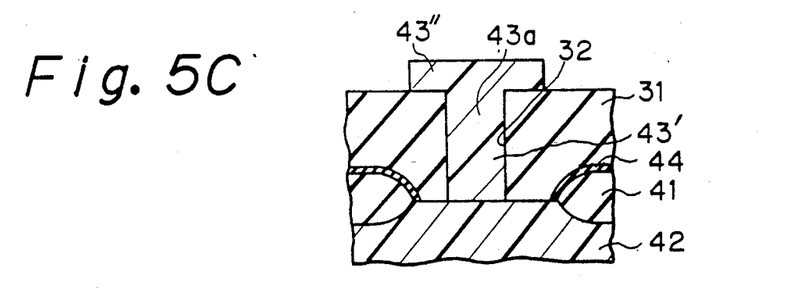

Referring now to FIG. 5C, silicon is grown epitaxially from the exposed surface of the active region 50 until it fills the hole 32 and covers a predetermined region of the oxide layer 31 surrounding the hole 32, thereby to form a T-shaped silicon projection 43 having a vertical portion 43′ and a top portion 43″. The silicon is preferably grown with increasing but controllable speed.

Figure 5D:
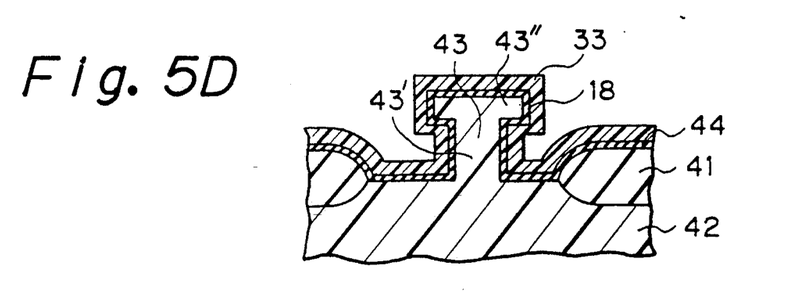

Referring to FIG. 5D, the entire oxide layer 31 is next removed with hydrofluoric acid solution (by the wet etching method). Since silicon and silicon nitride are scarcely affected by hydrofluoric acid solution, only the oxide layer 31 is removed by hydrofluoric acid solution. Thus, the Si projection 43 is obtained without using the dry etching process and undamaged.

A thin silicon oxide layer 18 having a thickness of about 120-150 A is formed on the surface of the active region 50 and the Si projection 43 by thermal oxidation. The thin oxide layer serves as a gate oxide layer of the MOSFET. A gate electrode poly-Si layer 33, having a thickness of about 3000 A and which has a low electrical resistance, is deposited on the thin oxide layer 18 and the silicon nitride layer 44 by the LPCVD method.

Figure 5E:
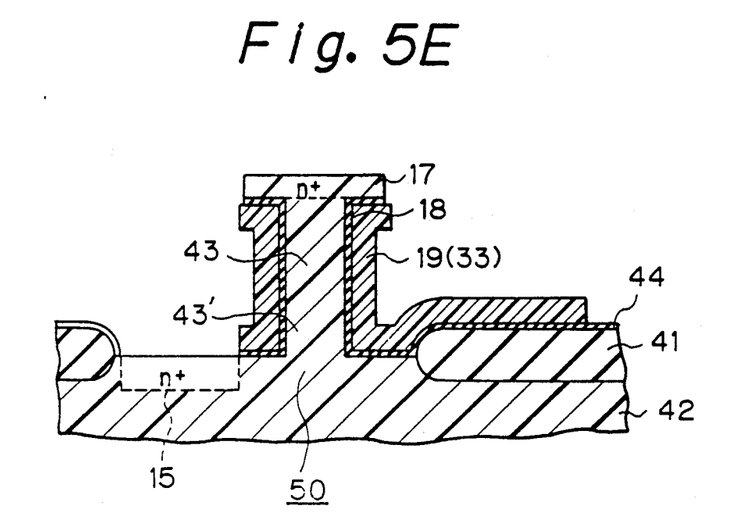

Next, as is illustrated in FIG. 5E, portions of first the gate electrode poly-Si layer 33, and then the silicon oxide layer 18, are removed by anisotropic dry etching, leaving only portions on the side surfaces of the Si projection 43 and on a predetermined region 50a of the active region 50 to the right of the projection 43 and a predetermined region 64a of the silicon nitride layer 44 to the right of the region 50a so as to form a gate electrode 19. Since the vertical portion 43' of the Si projection 43 is shadowed by the top portion 43", a mask for use during the anisotropic etching is needed only over the predetermined region 50a of the active region 50 and the predetermined region 44a of the silicon nitride layer 44. After that, phosphorous ions or arsenic ions are introduced into the top portion 43" of the Si projection 43 and the exposed active region 50 by ion implantation to form an $n^{30}$ drain region 17 and an $n^{30}$ source region 15.

Figure 5F:
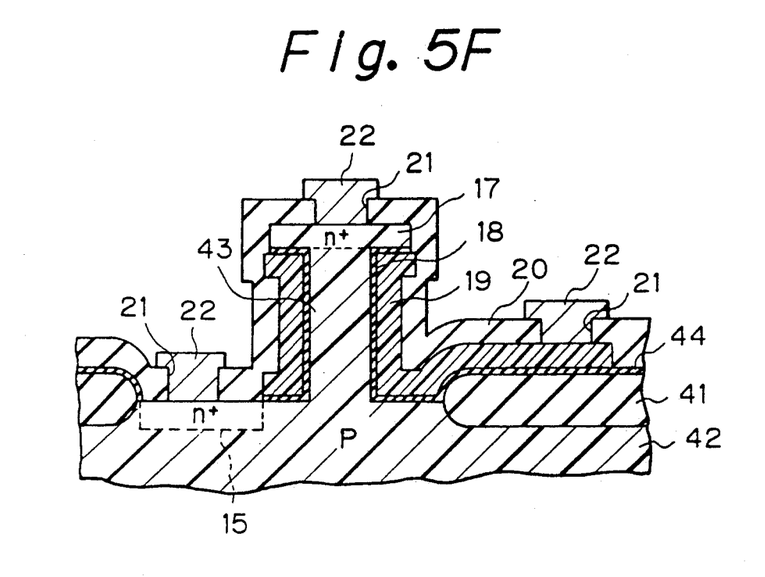

Referring to FIG. 5F, an insulating layer 20 is formed on the surface of the above structure. Portions of the insulating layer 20 are then selectively removed to form contact holes 21 on each of the source region 15, the drain region 17 and a part of the gate electrode 19. Wiring 22 is then provided in the contact holes 21.

According to the above described method, since the amount of epitaxial growth can be controlled, the Si projection 43 is formed without photolithographic etching.

An alternate method of manufacturing the semiconductor MOSFET of the second embodiment of the invention will now be described. The alternate method has the same steps as the method of manufacturing the MOSFET of the second embodiment described above with reference to FIGS. 5A, 5B, 5D to 5F. Therefore, only the steps of the alternate method which are different from earlier described method will be described herein with reference to FIGS. 6A and 6B.

Figure 6A:
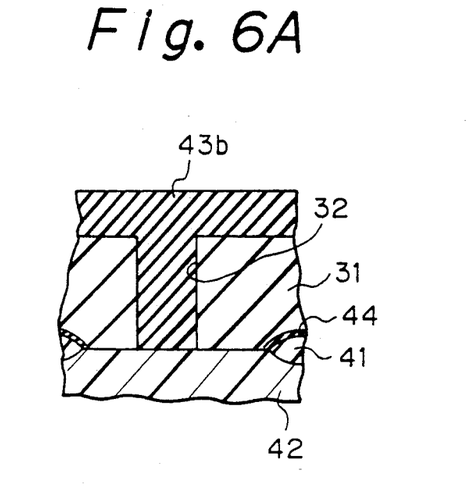
FIGS. 6A and 6B are sectional views showing parts of steps in another method of manufacturing the semiconductor MOSFET of the second embodiment of the invention.

As in the above described method of manufacturing the second embodiment, the structure shown in FIG. 5B is first obtained. Next, amorphous silicon ($a$-Si) 43b is deposited uniformly on this structure by the CVD method or by spattering in order to fill the hole 32 therewith as is illustrated in FIG. 6A. The speed of deposition of amorphous silicon 43b increases as the amorphous silicon 43b is deposited.

Figure 6B:
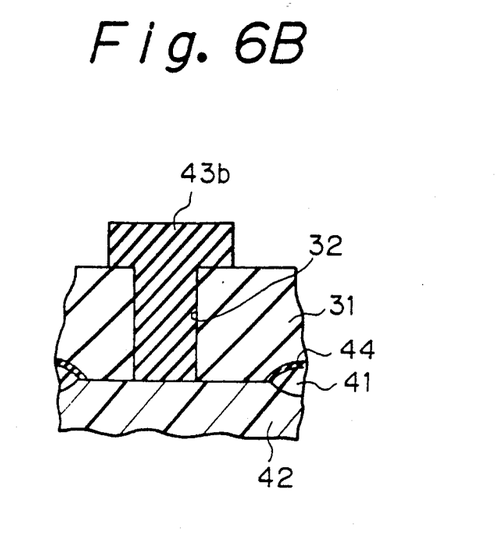

The deposited amorphous silicon 43b is monocrystallized from its interface with the silicon substrate 42 by a solid phase epitaxial growth method. All of the now monocrystalline amorphous silicon layer 43b except those portions in and around the hole 32 is then removed so as to leave a monocrystalline silicon projection 43 which is T-shaped in vertical section as shown in FIG. 6B.

After that, the MOSFET shown in FIG. 5F is obtained by the same steps described above with reference to FIGS. 5D-5F.

It will be understood that the above description of the present invention is susceptible to various modifications, changes and adaptations, and the same are intended to be comprehended within the meaning and range of equivalents of the appended claims. For example, while in the first embodiment an n-channel MOSFET is described, a p-channel MOSFET can be obtained by introducing p ions into the source and drain regions 15, 17.

What is claimed is:

1. A method of manufacturing a MOSFET having a projecting semiconductor portion, comprising the steps of:
   (a) providing a semiconductor body;
   (b) forming a mask layer on the semiconductor body, the mask layer having a hole which exposes the semiconductor body;
   (c) forming a semiconductor layer with a base portion in the hole extending from the semiconductor body and with a top portion on the mask layer around the hole, a cross section of the semiconductor layer having the shape of a T with a base along the base portion and a top along the top portion;
   (d) removing the mask layer by wet etching to expose the surface of the base portion of the semiconductor layer;
   (e) forming a gate insulating layer on the exposed surface of the base portion of the semiconductor layer;
   (f) forming a gate electrode layer on the gate insulating layer; and
   (g) introducing impurities into the top portion of the semiconductor layer and a predetermined region of the semiconductor body located adjacent to said semiconductor layer.

2. A method of manufacturing a MOSFET according to claim 1, wherein the semiconductor body is a polycrystalline silicon body.

3. A method of manufacturing a MOSFET according to claim 2, wherein said step of providing the semiconductor body comprises the steps of:
   preparing a silicon substrate,
   forming an oxide layer on the silicon substrate,
   forming a nitride layer on the oxide layer, and
   forming a polycrystalline silicon layer, which constitutes said polycrystalline silicon body, on the nitride layer.

4. A method of manufacturing a MOSFET according to claim 2, wherein said step of forming a semiconductor layer comprises the steps of:
   depositing polycrystalline silicon in the hole and on the mask layer, and
   removing portions of the polycrystalline silicon on the mask layer so as to retain only the polycrystalline silicon in the hole and on a portion of the mask layer around the hole.

5. A method of manufacturing a MOSFET according to claim 1, wherein the semiconductor body is a monocrystalline silicon body.

6. A method of manufacturing a MOSFET according to claim 5, wherein said step of providing the semiconductor body comprises the steps of:
   providing a monocrystalline silicone substrate,
   forming a field oxide layer on the monocrystalline silicon substrate,
   forming a nitride layer on the field oxide layer and the monocrystalline silicon substrate, removing the nitride layer formed on the silicon substrate.

7. A method of manufacturing a MOSFET according to claim 5, wherein said step of forming a semiconductor layer comprises the steps of:
   growing silicon from an exposed surface of the exposed semiconductor body in the hole to fill the hole with silicon and to cover a surface portion of the mask layer around the hole with silicon.

8. A method of manufacturing a MOSFET according to claim 7, wherein said step of growing silicon is performed epitaxially.

9. A method of manufacturing a MOSFET according to claim 5, wherein said step of forming a semiconductor layer comprises the steps of:
   depositing amorphous silicon in the hole and on the mask layer,
   monocrystallizing the deposited amorphous silicon, and
   removing some portions of the monocrystallized silicon so as to retain only portions of the monocrystallized silicon in the hole and on the oxide layer around the hole.

10. A method of manufacturing a MOSFET according to claim 9, wherein said step of monocrystallizing is performed by a solid phase epitaxial growth method.

11. A method of manufacturing a MOSFET according to claim 1, wherein said mask layer is an oxide layer.

12. A method of manufacturing a MOSFET according to claim 1, wherein said gate electrode layer has a cylindrical shape.

13. A method of manufacturing a MOSFET according to claim 1, wherein said step of forming a semiconductor layer comprises the steps of:
   depositing polycrystalline silicon in the hole and on the mask layer, and
   removing portions of the polycrystalline silicon on the mask layer so as to retain only the polycrystalline silicon in the hole and on a portion of the mask layer around the hole.

14. A method of manufacturing a MOSFET having a projecting semiconductor portion comprising the steps of:
   providing a semiconductor body;
   forming a mask layer on the semiconductor body with the mask layer having a hole which exposes a surface of the semiconductor body and which is defined by an interior surface of the mask layer;
   forming a semiconductor layer having a first portion which is disposed in the hole, is connected to the semiconductor body and has a peripheral surface contacting said interior surface of the mask layer, and a second portion disposed on the first portion and extending laterally on the outer surface of the mask layer around the hole so that a cross section of the semiconductor layer has a T-shape with a base along the first portion and a top along the second portion;
   removing the mask layer by wet etching to expose the peripheral surface of the first portion of the semiconductor layer;
   forming a gate insulating layer on the peripheral surface of the first portion of the semiconductor layer;
   forming a gate electrode layer on the gate insulating layer; and
   introducing impurities into the second portion of the semiconductor layer and into a predetermined region of the semiconductor body disposed adjacent the first portion of the semiconductor layer to form source and drain regions.

15. A method of manufacturing a MOSFET as defined in claim 14 wherein: said hole is cylindrical; the step of removing the mask layer includes removing the mask layer to expose the entire peripheral surface of the first portion of the semiconductor layer; and the steps of forming a gate insulating layer and a gate electrode layer include forming the respective layers completely around the first portion of the semiconductor layer, whereby the gate electrode has a cylindrical shape.

* * * * *